United States Patent
Starkey

(10) Patent No.: US 7,622,516 B1
(45) Date of Patent: *Nov. 24, 2009

(54) COMPOSITION OF EPOXY AND ANHYDRIDE COMPONENTS, ANTIOXIDANT AND PHOSPHOR MATERIAL

(75) Inventor: Dale Starkey, Olean, NY (US)

(73) Assignee: Henkel Corporation, Rocky Hill, CT (US)

( * ) Notice: Subject to any disclaimer, the term of this patent is extended or adjusted under 35 U.S.C. 154(b) by 243 days.

This patent is subject to a terminal disclaimer.

(21) Appl. No.: 11/551,968

(22) Filed: Oct. 23, 2006

Related U.S. Application Data

(63) Continuation of application No. 10/667,706, filed on Sep. 22, 2003, now Pat. No. 7,125,917, which is a continuation-in-part of application No. 09/875,323, filed on Jun. 6, 2001, now Pat. No. 6,989,412.

(51) Int. Cl.
*C08K 3/08* (2006.01)
*C08L 63/00* (2006.01)

(52) U.S. Cl. ........................ 523/458; 523/459; 525/508; 525/533

(58) Field of Classification Search ........................ None
See application file for complete search history.

(56) References Cited

U.S. PATENT DOCUMENTS

| | | | |
|---|---|---|---|
| 3,849,383 A * | 11/1974 | Fetscher et al. ............. 528/289 |
| 4,076,764 A * | 2/1978 | Bauer ......................... 525/511 |
| 4,178,274 A * | 12/1979 | Denk et al. .................. 523/427 |
| 4,288,264 A | 9/1981 | Haque |
| 4,298,650 A | 11/1981 | Lu |
| 4,362,946 A | 12/1982 | Cusano et al. |
| 4,485,200 A | 11/1984 | Perlinski et al. |
| 4,532,395 A | 7/1985 | Zukowski |
| 4,534,743 A | 8/1985 | D'Onofrio et al. |
| 4,551,488 A | 11/1985 | Leech et al. |
| 4,814,227 A | 3/1989 | Maeda et al. |
| 4,900,641 A | 2/1990 | Kohda et al. |
| 4,943,606 A | 7/1990 | Inoue et al. |
| 5,076,963 A | 12/1991 | Kameyama et al. |
| 5,149,971 A | 9/1992 | McElhaney et al. |
| 5,454,892 A | 10/1995 | Kardon et al. |
| 5,521,236 A | 5/1996 | Moy et al. |
| 5,624,979 A | 4/1997 | Kleiner et al. |
| 5,646,412 A | 7/1997 | Bryan et al. |
| 5,813,753 A | 9/1998 | Vriens et al. |
| 5,886,401 A | 3/1999 | Liu |
| 5,956,382 A | 9/1999 | Wiener-Avnear et al. |
| 5,973,034 A | 10/1999 | Mori et al. |
| 6,245,259 B1 | 6/2001 | Hohn et al. |
| 6,246,123 B1 * | 6/2001 | Landers et al. ............. 257/787 |
| 6,376,101 B1 | 4/2002 | Ota |
| 6,396,066 B1 | 5/2002 | Chen et al. |
| 6,501,102 B2 | 12/2002 | Mueller-Mach et al. |
| 6,518,600 B1 * | 2/2003 | Shaddock .................... 257/98 |
| 6,555,023 B2 | 4/2003 | Smith |
| 6,592,780 B2 | 7/2003 | Hohn et al. |
| 6,593,011 B2 | 7/2003 | Liu et al. |
| 6,603,258 B1 | 8/2003 | Mueller-Mach et al. |
| 6,603,259 B1 | 8/2003 | Kiryuschev et al. |
| 6,613,247 B1 | 9/2003 | Hohn et al. |
| 6,617,401 B2 | 9/2003 | Rubinsztajn |
| 6,632,892 B2 | 10/2003 | Rubinsztajn et al. |
| 6,713,571 B2 | 3/2004 | Shimada |
| 6,989,412 B2 * | 1/2006 | Starkey ...................... 523/458 |
| 7,125,917 B2 * | 10/2006 | Starkey ...................... 523/458 |
| 7,474,009 B2 * | 1/2009 | Starkey ...................... 257/788 |
| 2001/0028053 A1 | 10/2001 | Hohn et al. |
| 2001/0030326 A1 | 10/2001 | Reeh et al. |
| 2001/0046601 A1 | 11/2001 | Peruzzotti et al. |
| 2003/0001140 A1 | 1/2003 | Starkey |
| 2003/0071568 A1 | 4/2003 | Lowery et al. |
| 2003/0099859 A1 | 5/2003 | Liu et al. |
| 2003/0173540 A1 | 9/2003 | Mortz et al. |
| 2003/0178632 A1 | 9/2003 | Hohn et al. |
| 2004/0063840 A1 | 4/2004 | Starkey |

FOREIGN PATENT DOCUMENTS

| | | |
|---|---|---|
| JP | 52-15539 | 2/1977 |
| JP | 63-100391 | 2/1988 |
| JP | 63-100391 A * | 5/1988 |

* cited by examiner

*Primary Examiner*—Robert Sellers
(74) *Attorney, Agent, or Firm*—Steven C. Bauman

(57) ABSTRACT

A molding compound is provided for use in encapsulating electronic packages which include an optoelectronic component, such as an LED. The molding compound includes a partially cured epoxy composition, an antioxidant, and, optionally, a phosphor material substantially uniformly distributed throughout the epoxy composition. The optional phosphor material may be suspended within the epoxy composition by pre-reacting a portion of the epoxy composition prior to B-staging of the molding compound. As such, the optional phosphor material is suspended within the epoxy composition, thereby preventing settling of the phosphor material during B-staging, as well as during curing of the molding compound in the encapsulation process.

20 Claims, 1 Drawing Sheet

COMPOSITION OF EPOXY AND ANHYDRIDE COMPONENTS, ANTIOXIDANT AND PHOSPHOR MATERIAL

CROSS-REFERENCE TO RELATED APPLICATION

This application is a continuation of U.S. patent application Ser. No. 10/667,706 filed Sep. 22, 2003, now U.S. Pat. No. 7,125,917, which is a continuation-in-part of U.S. patent application Ser. No. 09/875,323 filed Jun. 6, 2001, now U.S. Pat. No. 6,989,412.

BACKGROUND OF THE INVENTION

1. Field of the Invention

The present invention relates to epoxy molding compositions. More particularly, the present invention relates to epoxy molding compositions which are particularly useful as optoelectronic encapsulants for light emitting devices.

2. Brief Description of Related Technology

Epoxy resin compositions are widely used for electronic packaging materials in the electronics industry and, in particular, as encapsulants for semiconductor elements and electronic circuits. Accordingly, epoxy resin-based compositions have been widely used in the formation of molding compositions for use as electronic packaging materials. Transparent epoxy molding compositions are well known for use as encapsulants in connection with optoelectronic devices, such as light-emitting diodes (LEDs), for use for lighting applications in the electronics industry.

LEDs have traditionally been multilayer epitaxial structures based mainly on AlGaAs and InGaAlP as basic materials, Such LEDs are typically encapsulated in a transparent epoxy composition, which is typically provided in a dome shape for efficient transmission of light from the LED.

Epoxy compositions useful in encapsulating optoelectronic devices such as LEDs may involve liquid-type compositions, which can be filled or poured about an LED and cured. Additionally, partially cured epoxy compositions may be used for encapsulating LEDs, in which an epoxy composition is partially cured or "B-staged" to form a "pellet", which can then be transfer molded with the electronic device under heat and pressure to encapsulate the LED.

More recently, GaN (gallium nitride)-based semiconductor devices have been used in UV/blue lasers and UV/blue LEDs. UV/blue LEDs are LEDs which are capable of emitting in the ultraviolet (UV) range, or in the blue range, or in both the UV and blue ranges of the electromagnetic spectrum. Conversion of UV/blue light from an LED to visible white light can be accomplished using phosphors, which are typically applied to the surface of the LED and then encapsulated with an epoxy encapsulant.

U.S. Pat. No. 5,886,401 to Liu discloses an LED structure including a transparent epoxy compound for encapsulating the LED, and including a phosphor layer coated on the outer surface of the epoxy compound. Such an arrangement requires additional manufacturing steps for providing the separate layers of epoxy and phosphor, which results in additional time and cost for manufacturing.

U.S. Pat. No. 5,149,971 to McElhaney et al. discloses a scintillator assembly which includes a body of optically-transparent epoxy and an amount of phosphor particles embedded within the body adjacent one surface. The phosphor particles are mixed within the liquid epoxy when in an uncured state and settle to the bottom surface of a mold in which the liquid epoxy is contained. Upon curing into a hardened body, the phosphor particles are coated on one surface thereof.

U.S. Pat. No. 5,813,753 to Vriens et al. discloses an LED for use in lighting applications which includes a UV/blue LED located in a depression of a cup, with the cup being filled with a light transmitting cycloaliphatic epoxy encapsulant with phosphor particles dispersed in the encapsulant or adhered to the surface of the LED. Such cycloaliphatic epoxy encapsulants are well known for use as liquid epoxy compositions in encapsulating electronics. Such liquid cycloaliphatic epoxy compositions, however, cannot be B-staged due to their inherent high reactivity. Moreover, because of their low viscosity, the phosphor particles typically settle out of the liquid composition during curing, thereby providing a non-uniform distribution of phosphor throughout the cured encapsulant.

Such epoxy compositions should be as resistant to heat and UV light as possible to help prevent degradation of the epoxy composition during operation of the light emitting device.

Accordingly, it would be advantageous to provide a molding composition useful as an optoelectronic encapsulant for LEDs which provides for substantially uniform distribution of phosphors and which is easy to manufacture and use as a molding composition. It would also be advantageous to provide a molding composition useful as an optoelectronic encapsulant for LEDs having improved resistance to heat and UV light.

SUMMARY OF THE INTENTION

An epoxy composition of the invention comprises the reaction product of an epoxy component and an anhydride component. The composition can further include an antioxidant material and/or an optional visible light emitting phosphor material substantially uniformly distributed throughout the composition. The composition is particularly useful for optoelectronic encapsulants for light emitting devices.

An encapsulant material for electronic components comprises a molding compound comprising a reaction product of a partially cured epoxy component and an anhydride component. The molding compound further includes an antioxidant material and, optionally, a phosphor material substantially uniformly distributed therethrough.

A method of preparing a molding compound comprises providing an epoxy composition, mixing an antioxidant material with the epoxy composition to provide a homogeneous mixture, increasing the viscosity of the homogeneous mixture to form a pre-reacted intermediate, and partially curing the epoxy composition of the pre-reacted intermediate, thereby forming the molding compound. An optional phosphor material can also be added to the composition.

Another method of preparing a molding compound comprises providing an epoxy composition comprising an epoxy component and an anhydride component, mixing an antioxidant material with the epoxy composition at a temperature of about 105° C. to about 115° C. to provide a homogeneous mixture, cooling the mixture to a temperature of about 50° C. to about 75° C., adding a polyol to the mixture for reaction with the anhydride component, increasing the temperature of the mixture to about 70° C. to about 85° C. for a time period of about 10 minutes to 60 minutes to cause an increase in the viscosity of the mixture, and B-staging the epoxy composition at a temperature of about 60° C. to 70° C., thereby forming the molding compound. An optional phosphor material can also be added to the composition.

A method of encapsulating an optoelectronic device comprises providing an optoelectronic device, providing a molding compound comprising a partially cured epoxy composition having an antioxidant material, encapsulating the optoelectronic device with the molding compound, and fully curing the epoxy composition. An optional phosphor material can also be added to the composition.

An optoelectronic device comprises a light-emitting diode having an encapsulant surrounding the light-emitting diode. The encapsulant comprises a reaction product of a cured epoxy composition including an antioxidant material and, optionally, a phosphor material.

DETAILED DESCRIPTION OF THE INVENTION

Figure 1:
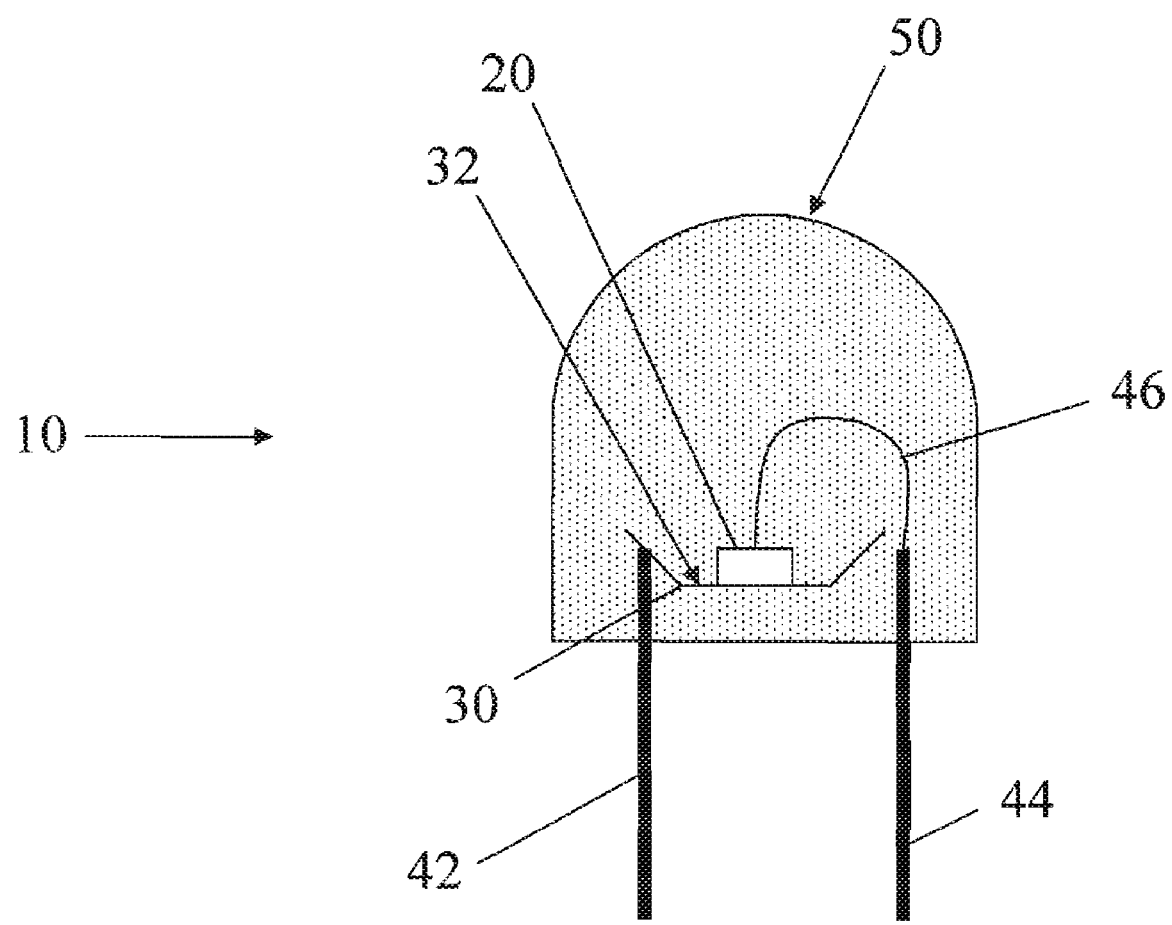
FIG. 1 is a schematic diagram of an optoelectronic device in accordance with the present invention.

As used herein, spatial or directional terms, such as "left", "right", "inner", "outer", "above", "below", "top", "bottom", and the like, relate to the invention as it is shown in the drawing figures. However, it is to be understood that the invention may assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims are approximations that may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to include the beginning and ending range values and to encompass any and all subranges subsumed therein. For example, a stated range of "1 to 10" should be considered to include any and all subranges between (and inclusive ot) the minimum value of 1 and the maximum value of 10; that is, all subranges beginning with a minimum value of 1 or more and ending with a maximum value of 10 or less, e.g., 5.5 to 10. Unless stated otherwise, as used in the specification and claims, molecular weights are number average molecular weights for polymeric materials indicated as "$M_n$" and obtained by gel permeation chromatography using polystyrene as a standard.

The present invention is directed to a composition of matter and, in one particular embodiment, to a molding compound, such as for use in encapsulating electronic packages, which can include an optoelectronic component, such as an LED. The molding compound of the present invention includes a partially cured epoxy composition and, in one embodiment, can include an antioxidant. In a further embodiment, a phosphor material can also be uniformly distributed throughout the epoxy composition. Providing the antioxidant material improves the heat and UV resistance of the molding compound. By providing the phosphor material within the partially cured epoxy composition, the phosphor material can be suspended within and substantially uniformly distributed throughout the epoxy composition, thereby preventing settling of the phosphor material during curing thereof in the encapsulation process.

As noted, the molding compound of the present invention includes an epoxy composition. The epoxy composition can be a substantially transparent epoxy composition capable of transmitting light emitted from an LED, as is known in the art. In one application, the epoxy composition used in the molding compound of the present invention can be the reaction product of an anhydride of a cyclic dibasic acid and an epoxy-containing compound.

The cyclic anhydride component used in the present invention can be a cycloaliphatic anhydride, such as but not limited to hexahydrophthalic anhydride (HHPA) or methyl hexahydrophthalic anhydride (MHHPA). Small quantities of other related anhydrides, such as but not limited to tetrahydrophthalic anhydride and phthalic anhydride, may be present with the cyclic anhydride. In one embodiment, these other related anhydrides, if present, are present in an amount of no more than 25% of the total cyclic acid anhydride content, e.g., 5% to 25%, for best results.

As the epoxy component, any thermosetting epoxy resin may be used which is capable of being B-staged, as will be discussed in more detail herein. Particularly desirable are solid epoxy resins and, in particular, tri- or multi-functional epoxy resins. Non-limiting examples of useful epoxy resins include solid epoxy resins derived from bisphenol A or F, tetramethyl and/or biphenyl, and epichlorohydrin, novalacs, and the like. Triglycidyl isocyanurate (TGIC) is particularly desirable. An example of a particularly useful product is tris(2,3-epoxy-propyl) isocyanurate, sold under the tradename TEPIC® by Nissan Chemical Industries, Ltd.

Examples of other useful epoxy components include epoxy monomers characterized by structures I and II below.

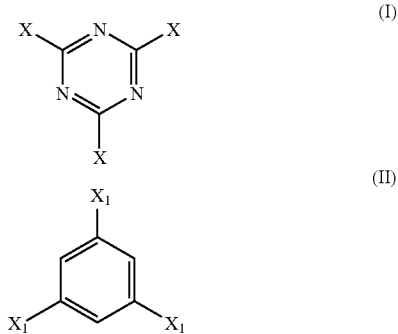

In structures I and II, X can be present at least once on structure I (i.e., mono-, di-, or ti-substituted) and itself may be chosen from H or $D_nA$, where n can range between 0 and 1, with at least one X being $D_nA$. D, if present (i.e., if n=1), can be attached to the ring and can be chosen from O, S, or NH. A can be attached to D (if present) or directly to the ring (if D is not present, i.e., n=0). A can be represented by structure III below:

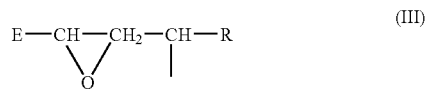

where E can be a member selected from H, alkyl, alkenyl, alkynyl, and/or alkoxy groups which may be linear, branched, or cyclic, and/or aryl groups, having from 1 to 20 carbon atoms with or without substitution by halogen, silicon, hydroxy, nitrile, ester, amide, or sulfate. R can be selected from H, alkyl, alkenyl, alkynyl, and/or alkoxy groups which may be linear, branched, or cyclic, and aryl groups, having from 1 to about 20 carbon atoms, with or without substitution by halogen, silicon, hydroxy, nitrile, ester, amide, or sulfate.

$X_1$ can be present at least once on structure II (i.e., mono-, di-, or tri-substituted) and itself may be chosen from H or $O = CD_nA$ with at least one $X_1$ being $O = CD_nA$, where $D_n$ and A can be as defined above.

Another suitable epoxy component can be represented as:

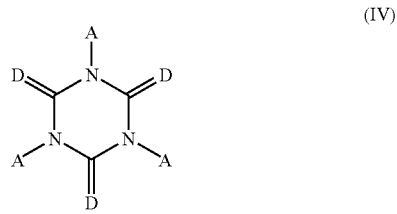

where D and A can be as described above and can be present at least once and can also be present together attached to ring atoms which are in alpha-beta relation to one another.

Examples of particular epoxy components incorporating the above concepts include, but are not limited to, those shown in formulas V-VII below.

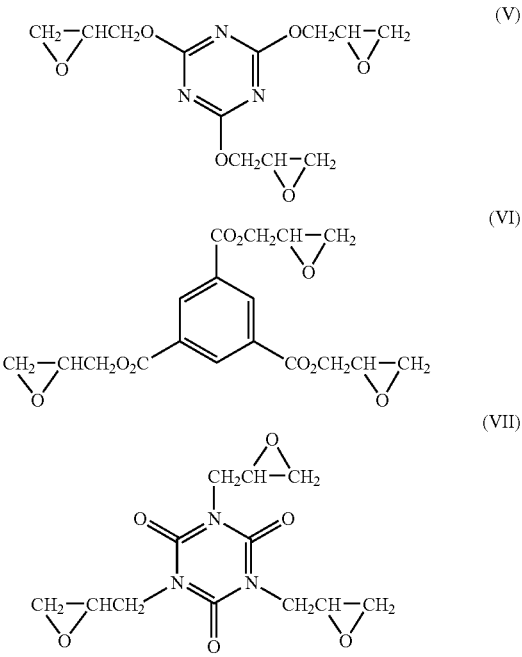

In order to promote reaction of the cyclic anhydride component and the epoxy component, the anhydride ring must be opened. Various agents can be incorporated into the epoxy composition to assist in this ring opening reaction. Such ring opening can be accomplished, for example, by active hydrogens present as water, or by hydroxyls, or by a Lewis base. In one application, a polyol can be incorporated into the epoxy composition to assist in the ring opening of the anhydride and to promote curing of the epoxy composition. The polyol can be a lower aliphatic polyol of 3 to 6 carbon atoms and 2 to 4 hydroxyls, such as of 3 hydroxyls, although in some cases minor proportions of other polyols may be blended in, provided that they do not adversely affect the molding compound properties. Suitable polyols include, but are not limited to, glycerol and trimethylol propane (TMP), alone or in mixture. Other polyols of the group described may be utilized in minor proportions, generally being less than 25%, e.g., 5% to 25%, of the polyol content. Among these are ethylene glycol, diethylene glycol, propylene glycol, dipropylene glycol and neopentyll glycol. A suitable substitute material for these or for part of them is propoxylated pentaerythritol, a tetrol having a molecular weight of about 400, sold under the name PeP-450.

This propoxylated pentaerythritol may be used in small quantities, generally being limited to 5% to 25% of the polyol content, preferably on a hydroxyl content basis. In the selection of the "supplementing" polyols, it will often be most desirable to employ those which are liquid at room temperature or with heating to comparatively low temperatures. However, comparatively high melting materials, e.g., pentaerythritol, may be employed, preferably as a small proportion of polyol component.

The various reactants can be essentially pure, e.g., over 95% pure, such as over 99% pure, such as 99.9% to 100% pure. Of course, they should be clean and colorless and water content is to be avoided.

Although the reactions to make the molding compounds and subsequently to cure them may be effected without a catalyst, sometimes, in order to speed the reaction, the presence of a catalyst may be useful. It has been found that a relatively small group of catalytic materials, tin soaps of fatty acids of 8 to 18 carbon atoms, can exert a catalytic effort without impairing the clarity, colorless nature, and other desirable properties of the molding compound and the finished cured product.

Minor proportions of adjuvants which have specific desirable effects may also be included in the molding compound. For example, mold release agents may be employed. Among the mold releases, higher fatty acids of 12 to 20 carbon atoms, or lower alcohol (1 to 3 carbon atoms) esters thereof, preferably saturated, and most preferably stearic acid or methyl stearate, are utilized because they are very effective in easily releasing the product from the mold.

As noted above, in addition to the epoxy composition, the molding compounds of the present invention further can include one or more phosphor materials evenly distributed therethrough. The phosphor material is capable of converting light which is emitted from an LED into visible white light. The phosphor material(s) can be a phosphor which is capable of converting and emitting one color (broadband, narrow band or multi-line, e.g., red, green, blue, yellow, or white), or a mixture of phosphors which are capable of converting and emitting different colors to get a good color rendering. In particularly desirable applications, the molding compound of the present invention is provided for use with an LED capable of transmitting UV and/or blue light, and the phosphor material is capable of converting such UV and/or blue light into visible white light, in particular, light having a wavelength in the known visible white light range, such as about 400 nm to about 800 nm. The phosphor material can be provided in the form of particles or grains, which can be intermixed within the epoxy composition, as will be described in more detail herein.

As noted, the phosphor material may be selected from any known phosphor which, in combination with a UV or blue LED, will produce the desired light emission. For example, as is known in the art, yellow phosphor with a blue LED can be used to produce white light. A non-limiting example of a particular phosphor is Yttrium Aluminum Garnet ("YAG") yellow phosphor, which has a peak emission of about 575 nm. Such a phosphor is particularly useful for producing visible white light in combination with InGaN blue LED, which has a peak emission at 465 nm. Examples of other suitable phosphors include, but are not limited to, those phosphors disclosed in U.S. Pat. Nos. 5,149,971; 5,813,753; and 5,886,401, which are herein incorporated by reference.

As noted above, in addition to the epoxy composition, the molding compounds of the present invention further can include one or more antioxidant materials. The antioxidant material(s) can be a material capable of enhancing the UV and/or heat resistance of the molding compound. The antioxidant material can be selected from any known antioxidant material which can enhance the UV and/or heat resistance of the molding compound. Examples of suitable antioxidants include, but are not limited to, primary (phenolic) antioxidants, and desirably esters having pendant hydroxyphenyl groups. Particularly desirable are alkyl salts of propionic acid, and more desirably, those including a sulfur bridge. In one embodiment, the antioxidant material can include a thiodialkylpropionate, such as but not limited to thiodiethylenepropionate. In one particular embodiment the antioxidant material comprises thiodiethylene bis[3-(3,5-di-tert-butyl-4-hydroxyphenyl)propionate], commercially available from Ciba Specialty Chemicals under the tradename IRGANOX®) 1035. Other useful oxidants include those also commercially available from Ciba Specialty Chemicals under the tradename IRGANOX® 1010 and IRGANOX® 1076.

The proportions of the various components of the molding compounds employed are such as to produce the monoester of the acid anhydride and have the glycidyl moiety of the triglycidyl isocyanurate react with the acid group resulting from the anhydride-polyol reaction. Of course, in the present reactions, it is possible that a molecule of polyol may react with both carboxyls which may be considered to have come from the anhydride, or polyol hydroxyls from different polyol molecules may each react with the carboxyls. Similarly, more than one glycidyl moiety of the triglycidyl isocyanurate may react with anhydride carboxyls and, in some cases, such reactions may be effected before the anhydride reacts with polyol. However, in most instances, the reactions may be considered to be those as initially described, with a polyol forming a monoester with an acid anhydride and a glycidyl moiety of triglycidyl isocyanurate reacting with a free carboxylic acid group generated by the previous reaction. Such reactions may be considered to be effected when the three reactants are simultaneously reacted.

Desirably, the molding compound includes from about 20 weight percent to about 75 weight percent of the epoxy-containing compound based on the total weight of the molding compound, such as from about 30 weight percent to about 60 weight percent of the epoxy-containing compound based on the total weight of the molding compound, more desirably from about 30 weight percent to about 50 weight percent of the epoxy-containing compound based on the total weight of the molding compound. The molding compound can include from about 20 weight percent to about 75 weight percent of the acid anhydride based on the total weight of the molding compound, such as from about 30 weight percent to about 55 weight percent of the acid anhydride based on the total weight of the molding compound, more desirably from about 40 weight percent to about 55 weight percent based on the total weight of the molding compound. Additionally, the molding compound can include from about 5 weight percent to about 20 weight percent of the polyol based on the total weight of the molding compound, such as from about 5 weight percent to about 10 weight percent of the polyol based on the total weight of the molding compound. The molding compound can include from about 0.01 weight percent to about 5 weight percent of the antioxidant material, such as about 0.05 weight percent to about 1 weight percent, more desirably about 0.05 weight percent to about 0.5 weight percent, based on the total weight of the molding compound. The molding compound can optionally include from about 0.5 weight percent to about 35 weight percent of the phosphor material based on the total weight of the molding compound, such as about 5 weight percent to about 12 weight percent of the phosphor material based on the total weight of the molding compound. When a mold release agent is incorporated into the molding compound, such a mold release is desirably provided in an amount of from about 0.1 weight percent to about 2 weight percent based on the total weight of the composition.

If present, the phosphor material can be substantially uniformly distributed throughout the molding compound. Such a uniform distribution of the phosphor material can prevent settling of the phosphor material during curing of the encapsulant over the optoelectronic component, which can result in inconsistent levels of light emitted through the encapsulant. Providing the phosphor material uniformly distributed throughout a molding compound, however, can be difficult due to settling of the phosphor material, which can occur during final cure of the molding compound or, in the case of pre-formed molding compounds, during B-stage curing of the molding compound. Such settling is believed to be due to the high specific gravity associated with such phosphor materials, as well as the low viscosity of a typical epoxy composition for use in a molding compound.

The phosphor material can be substantially uniformly distributed throughout the epoxy composition and maintained with such a uniform distribution by increasing the viscosity of the epoxy composition while maintaining the phosphor material uniformly distributed throughout the epoxy composition, such as through continued mixing, thus suspending the phosphor material within the epoxy composition to form a pre-reacted intermediate. As such, the molding compound can be provided as a reaction product of such a pre-reacted intermediate.

The antioxidant material can also be uniformly distributed throughout the molding compound in similar manner as described above for the phosphor material.

Preparation of the Molding Compound of the Present Invention can involve a pre-mixing of the epoxy composition with the optional phosphor material and/or the antioxidant material to provide a homogeneous mixture, wherein the optional phosphor material and/or the antioxidant material can be substantially evenly distributed within the epoxy composition. This may be accomplished by combining and mixing the epoxy compound, the anhydride component, the antioxidant material, and the optional phosphor material. Desirably, such mixing occurs at a temperature of from about 80° C. to about 140° C., more desirably from about 105° C. to about 110° C., for a period of about 10 minutes to about 20 minutes. No significant reaction occurs during this mixing step.

The thus prepared mixture can be cooled to a temperature of about 45° C. to about 85° C., desirably 60° C. to about 65° C. The polyol can then be added to the mixture thus prepared with continued mixing, for example, through the use of a mixing blade. Addition of the polyol is believed to initiate a reaction with the anhydride, thereby forming a half acid/half ester. The temperature of the mixture can be increased to about 70° C. to about 80° C., such as about 75° C., over a period of about 10 to 30 minutes, such as 20 to 30 minutes, with continued mixing of the components. During this time, the epoxy composition begins to cure, and the viscosity of the mixture slowly increases. Such an increase in viscosity due to partial curing of the epoxy composition suspends the optional phosphor material within the partially cured epoxy composition. During this initial partial curing, the viscosity of the composition can be increased to about 300 to 900 centipoise (cps) at 75° C. As such, a pre-reacted intermediate product is formed. In one embodiment, this intermediate product has a number average molecular weight of from about 300 to about 1,000.

It is noted that the viscosity of the pre-reacted intermediate can be directly related to the amount of phosphor material incorporated therein, as well as the particle size and surface treatment of the phosphor material. For example, a pre-reacted intermediate product, according to the present invention, including about 12 weight percent of phosphor material based on the total weight of the composition, may achieve a viscosity of about 600 to 800 cps when heated at 75° C. for a period of 20 minutes. A similar epoxy composition without any phosphor material incorporated therein achieves a viscosity of about 400 cps under similar conditions of 75° C. heating for a period of 20 minutes. Accordingly, including the phosphor material results in achieving an increased viscosity in the composition in a shorter time period.

To form the molding compound, this intermediate product can be further partially cured. Desirably, the intermediate product is transferred to cavities or molds for B-staging of the composition. B-staging of the composition helps to speed molding times during subsequent molding encapsulation procedures by polymerizing the epoxy composition at a comparatively low temperature, making it possible to produce a stable molding compound (stable for several months at room temperature) which will be satisfactorily moldable in a subsequent molding encapsulation procedure, with a short curing period. B-staging can be effected at a temperature in the range of 50° C. to 100° C., more desirably 60° C. to 80° C., most desirably at about 65° C., for a period of 30 minutes to 24 hours, preferably from 10 to 20 hours, when no catalyst is used. With catalyst, the times may be from ¼ to ⅔ of those noted.

B-staging can be continued until a spiral flow of about 30 to about 50 inches, such as 25 to 40 inches, is achieved, using testing procedures well known in the art. Such B-staging results in formation of a partially cured molding compound, i.e., having approximately 40% to 60% of the epoxy moieties of the epoxy compound being reacted. As such, the molding compound is sufficiently polymerized so as to be cured quickly in a subsequent molding operation. After B-staging, the resin may be size reduced to a suitable particle size range, e.g., 1/16 inch to ¼ inch diameter. Alternatively, it can be B-staged to a pre-form shape in a suitably sized mold and, after ejection from the mold, may be employed directly. In this manner, the molding compound acquires the shape of the mold, producing a stable product, such as a pellet, for later curing during an encapsulation process.

The molding compound can have a number average molecular weight of above about 1,400, desirably from about 5,000 to about 20,000, due to the partial curing of the epoxy composition. As such, the molding compound represents a reaction product of the intermediate product, which is itself a partially cured epoxy composition having the antioxidant material and the optional phosphor material uniformly distributed therethrough. Moreover, since the B-staging was conducted with the pre-reacted intermediate product having the optional phosphor material uniformly suspended therein, the final molding composition includes the phosphor material substantially uniformly distributed throughout the molding composition.

As discussed, the molding compound of the present invention can be provided in a substantially solid form, such as a pellet. Molding compositions provided in such pellet form for use, for example, in transfer press molding applications, are known in the art, and typically involve an epoxy-containing compound in which the epoxy composition has been partially reacted to form a partially cured reaction product. By incorporating the antioxidant material and/or the optional phosphor material into the molding compound within the partially reacted structure thereof the antioxidant material and/or the optional phosphor material can be maintained evenly throughout the structure of the molding compound. Accordingly, during final curing of the molding compound during encapsulation, the phosphor material can be maintained in a substantially uniform distribution throughout the molding compound, thereby resulting in an encapsulated electronic component in which the fully cured encapsulant includes a phosphor material evenly and homogeneously distributed throughout the structure thereof.

An advantage of the present molding compounds is achieved in the ability to B-stage the molding compounds. Thus, although cycloaliphatic epoxy resins are reputed to be useful as encapsulants, they are liquids and cannot be B-staged with HHPA. Any initial reaction between the anhydride, polyol, and cycloaliphatic resin would form a cross-linked pellet which would not flow when heated and would, therefore, not be useful as a molding composition for the present invention.

The present invention further provides a method for encapsulating an optoelectronic device using such a molding compound. In such a method, the optoelectronic device, such as an LED, is provided, along with a molding compound which includes an antioxidant material with or without an optional phosphor material uniformly distributed and homogeneously mixed within a partially cured epoxy composition. The LED is encapsulated with the molding compound and the epoxy composition is fully cured.

More particularly, molding processes using the prepared molding compound may be accomplished by any known method, including utilization of pre-forms and transfer molding or compression molding, wherein the polymer is thermoset to final structure. Primarily, the present molding compounds are intended for transfer molding. After curing, the finished product is ejected from the mold and such removal may often be effected immediately, without the need for any cooling. The polymer is normally employed to cover, strengthen, rigidify, and/or insulate an enclosed material and such is present in the mold during the curing operation. Molding can be accomplished in short time periods, as low as 45 seconds, and normally within the range of one to five minutes, at a temperature of about 130° C. to 175° C., preferably from 140° C. to 160° C. Molding pressures (transfer molding) may be varied widely but will normally be in the range of 300 to 2,000 lbs/sq. in.

Although an important application of the present molding compounds relates to light-emitting electronic devices, covered, stabilized, and protected by the cured compositions in operations in which preformed or particulate molding compounds are utilized, the polymers and molding compounds are not limited to such applications but can find more general uses as structural materials, printed circuit substrates, potting compounds, encapsulants, insulators, etc.

In a further aspect, the present invention also provides an optoelectronic device in the form of a light-emitting diode having an encapsulant surrounding the light-emitting diode. The encapsulant can be the reaction product of a cured epoxy composition having an antioxidant material and/or a phosphor material substantially uniformly distributed therethrough, as described hereinabove. Such an optoelectronic device is depicted generally in FIG. 1.

FIG. 1 depicts an optoelectronic device 10 which includes an LED 20 encapsulated by an encapsulant 50. LED 20 may be any LED as is known in the art. For example, LED 20 may desirably be an LED stack having a multi-layer structure, with an upper ohmic contact and a lower ohmic contact, as is known in the art. LED 20 is positioned within reflector cup 30, which includes a reflective surface 32, such as a mirror. Reflector cup 30 is in electrical communication with the lower ohmic contact of LED 20.

Optoelectronic device 10 further includes lead wires 42 and 44. Lead wire 42 is in electrical communication with the lower ohmic contact of LED 20 through reflector cup 30, and lead wire 44 is in electrical communication with the upper ohmic contact of LED 20, for example through bond wire 46.

Optoelectronic device 10 further includes encapsulant 50 surrounding and encapsulating LED 20. Encapsulant 50 includes a reaction product of a cured epoxy composition having an antioxidant material and/or a phosphor material substantially uniformly distributed therethrough, as is described in detail hereinabove. Encapsulant 50 surrounds LED 20 and is formed in the shape of a dome, with relatively large dimensions as compared to LED 20. Encapsulant 50 may be formed about LED 20 through a transfer molding process, as is known in the art.

Activation of LED 20 through electrical current supplied by lead wires 42 and 44 causes emission of light, such as UV and/or blue light, from LED 20. Such light is converted to visible light by the optional phosphor material within encapsulant 50. Since encapsulant 50 includes the optional phosphor material substantially uniformly distributed throughout the epoxy composition, the light is converted and distributed substantially uniformly through encapsulant 50, thereby providing for uniform emission of visible light from the optoelectronic device.

The present invention will be further exemplified through the following examples, which demonstrate the preparation of molding compositions of the present invention, as well as comparisons of such molding compositions with prior art compositions. Unless otherwise indicated in the examples and elsewhere in the specification and claims, all parts and percentages are by weight, temperatures are in degrees centigrade, and pressures are at or near atmospheric pressure.

EXAMPLES

Example 1

A molding composition was prepared having the following components:

TABLE 1

| COMPONENT | WEIGHT % |
| --- | --- |
| HHPA[1] | 45.24 |
| TGIC[2] | 34.55 |
| Stearic Acid | 1.00 |
| Phosphor | 12.00 |
| Glycerin | 7.21 |
| Total | 100.00 |

[1]hexahydrophthalic anhydride
[2]triglycidyl isocyanurate

The above components were mixed and the mixture was poured into a molding tray for B-staging. B-staging was accomplished by heating the mixture to a temperature of 65° C. for a time period of about 17 hours, until a spiral flow of 30 to 50 inches was achieved, using a standard test procedure as is known in the art. After B-staging, the molded compound thus formed was analyzed for phosphor content at the top, middle, and bottom portions of the compound relative to the positioning in the mold. Analysis of the molded compound determined the phosphor content to be 11.3% at the top portion, 11.4% at the middle portion, and 11.6% at the bottom portion.

Example 2

A molding composition having the same proportion of components as set forth in Example 1 was prepared. In the composition of Example 2, however, the triglycidyl isocyanurate, hexahydrophthalic anhydride, and stearic acid components were mixed with the phosphor in a liquid reaction vessel at a temperature of 105° C. to 110° C. while stirring. The mixture was allowed to cool to about 60° C. to 65° C., and then the glycerin was added. The temperature of the mixture was increased to about 75° C. over a 20 minute period, with continuous mixing of the components using a mixing blade. After 20 minutes, the composition had a viscosity of about 750 cps at 75° C.

The mixture was then transferred into a molding tray for B-staging. B-staging was accomplished in a similar manner as in Example 1, by heating the mixture to a temperature of 65° C. for a time period of about 17 hours, until a spiral flow of 30 to 50 inches was achieved. After B-staging, the molded compound thus formed was analyzed for phosphor content at the top, middle, and bottom portions of the compound relative to the positioning in the mold. Analysis of the molded compound determined the phosphor content to be 11.9% at each of the top, middle, and bottom portions.

A comparison of the results of Examples 1 and 2 demonstrates the uniform distribution of the phosphor material in the sample which was pre-reacted to suspend the phosphor within the epoxy compound prior to B-staging, as compared with a sample which did not involve such a pre-reaction.

Example 3

A series of molding compositions having the same proportion of components as set forth in Examples 1 and 2 were prepared with the components pre-reacted with the phosphor as in Example 2 for varying reaction times. In particular, 12 separate samples were mixed in a liquid reaction vessel as in Example 2, at a temperature of 105° C. to 110° C. while stirring. The mixtures were allowed to cool to about 60° C. to 65° C., and then the glycerin was added.

The temperature of the mixture was increased to about 75° C., with continuous mixing of the components using a mixing blade for varying time periods from 5 minutes to 40 minutes. The mixture was then transferred into a test tube, and was B-staged in a similar manner as in Example 2, by heating the mixture to a temperature of 65° C. for a time period of about 17 hours, until a spiral flow of 30 to 50 inches was achieved. After B-staging, each of the molded compounds thus formed was analyzed for phosphor content at the top and bottom portions of the compounds relative to the positioning in the test tube, with the results shown in Table 2.

TABLE 2

| PRE-REACTION TIME (minutes) | PHOSPHOR CONTENT | | | PHOSPHOR SETTLE (%) |
| --- | --- | --- | --- | --- |
| | TOP HALF OF PELLET (%) | BOTTOM HALF OF PELLET (%) | AVERAGE (%) | |
| 5 | 10.0 | 13.1 | 11.5 | 3.1 |
| 5 | 8.2 | 14.2 | 11.2 | 6.0 |
| 10 | 10.9 | 12.3 | 11.6 | 1.4 |
| 10 | 10.5 | 12.6 | 11.6 | 2.1 |
| 15 | 11.4 | 12.3 | 11.9 | 0.9 |
| 15 | 11.4 | 12.2 | 11.8 | 0.8 |
| 20 | 11.8 | 12.1 | 11.9 | 0.3 |
| 20 | 11.8 | 12.1 | 12.0 | 0.3 |
| 30 | 12.0 | 12.1 | 12.0 | 0.1 |
| 30 | 11.9 | 12.1 | 12.0 | 0.2 |
| 40 | 12.0 | 12.1 | 12.0 | 0.1 |
| 40 | 12.0 | 12.1 | 12.0 | 0.1 |

The results of Example 3 demonstrate that uniform distribution of the phosphor material is dependent upon pre-reaction of the sample. As can be seen from the results in Table 2, the amount of phosphor settling out of the composition is greatly decreased when pre-reaction of the samples to suspend the phosphor within the epoxy compound prior to B-staging is carried out for longer periods of time. The results of Example 3 further demonstrate that phosphor settling is substantially eliminated after pre-reaction for 20 minutes or more.

Example 4

Molding compositions were prepared having the following components:

TABLE 3

| COMPONENT | SAMPLE 1 WEIGHT % | SAMPLE 2 WEIGHT % |
|---|---|---|
| HHPA[1] | 52.48 | 52.38 |
| TGIC[2] | 36.62 | 36.62 |
| Stearic Acid | 1.00 | 1.00 |
| Silane #1 | 0.50 | 0.50 |
| Silane #2 | 0.50 | 0.50 |
| Dye | 0.50 | 0.50 |
| Antioxidant[3] | — | 0.10 |
| Neopentyl Glycol | 8.40 | 8.40 |
| Total | 100.00 | 100.00 |

[1]hexahydrophthalic anhydride
[2]triglycidyl isocyanurate
[3]IRGANOX ® 1035

The MHHPA, TGIC, and antioxidant, where included, were mixed at about 110° C. for 10 to 20 minutes. This mixture was then cooled to 65° C. and the remaining components were added. This mixture was then heated to 75° C. and held at 75° C. for about 20 to 30 minutes. The mixture was poured into a molding tray for B-staging. B-staging was accomplished by heating the mixture to a temperature of 65° C. for about 12 hours, until a spiral flow of 25 to 40 inches was achieved, using a standard test procedure as is known in the art.

These molding compounds were tested for percent transmission at 400 nm both initially, and after exposure to 125° C. for 1,000 hours, with the results shown in Table 4.

TABLE 4

| | SAMPLE 1 % transmission at 400 nm | SAMPLE 2 % transmission at 400 nm |
|---|---|---|
| Initial | 81.4 | 81.9 |
| After 1000 hours at 125° C. | 73.3 | 78.5 |

As can be seen through the results in Table 4, Sample 1 demonstrated a transmission loss of 8.1%, while Sample 2, which included an antioxidant within the composition, demonstrated a significantly lower transmission loss of 3.4%

In addition, the molding compounds were tested for the change in yellowness index after exposure to 125° C. for 1,000 hours, represented by the transmission at 800 nm/transmission at 400 nm. Sample 1 demonstrated a change in yellowness of 0.15, while Sample 2 demonstrated a change of only 0.04.

The foregoing examples are intended to illustrate, without limitation, the molding compositions and methods of the present invention.

What is claimed is:

1. A molding composition, comprising a reaction product obtained through partial curing of the following:

a) an epoxy composition comprising the reaction product of:
  i) an epoxy resin, and
  ii) an anhydride component;
b) an antioxidant material; and
c) a visible light-emitting phosphor material substantially uniformly distributed throughout said molding composition through initial partial curing of said epoxy composition of component a) to suspend said phosphor material of component c) therein prior to partial curing of said reaction product of components a), b) and c).

2. A molding composition as in claim 1, wherein the epoxy component comprises epoxy monomers within structures I and II represented as:

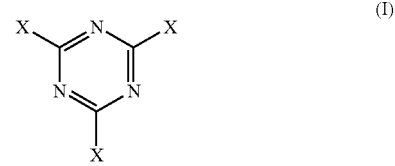

(I)

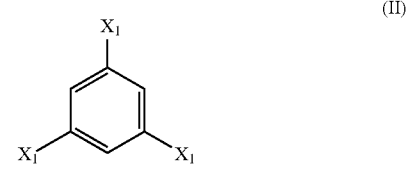

(II)

where X is present at least once on structure I and is selected from the group consisting of H and $D_nA$ provided at least one of X is $D_nA$, where n can range from 0 to 1, where D can be attached to the ring and can be selected from the group consisting of O, S, and NH and A is attached to D, if D is present, or to the ring if D is not present, and is represented by structure III:

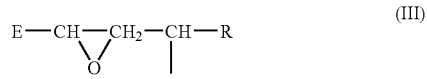

(III)

where E is selected from the group consisting of H, alkyl, alkenyl, alkynyl, or alkoxy groups which may be linear, branched, or cyclic, or aryl groups, having from 1 to about 20 carbon atoms, with or without substitution by halogen, silicon, hydroxy, nitrile, ester, amide, or sulfate;

where R is selected from the group consisting of H, alkyl, alkenyl, alkynyl, or alkoxy groups which may be linear, branched, or cyclic, or aryl groups, having from 1 to about 20 carbon atoms, with or without substitution by a member selected from the group consisting of halogen, hydroxy, nitrile, ester, amide, and sulfate; and $X_1$ is present at least once on structure II and is a member selected from the group consisting of H and $O=CD_nA$, provided that at least one $X_1$ is $O=CD_nA$.

3. A molding composition as in claim 1, wherein said epoxy component comprises materials within the structure represented by:

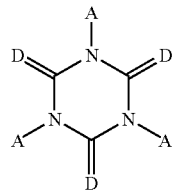

(IV)

where D is selected from the group consisting of O, S, and NH, and A is represented by the structure:

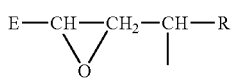

(III)

where E is selected from H, alkyl, alkenyl, alkynyl, alkoxy groups which may be linear, branched, or cyclic, and aryl groups, having from 1 to 20 carbon atoms with or without substitution by halogen, silicon, hydroxy, nitrile, ester, amide, or sulfate, and where R is selected from H, alkyl, alkenyl, alkynyl, alkoxy groups which may be linear, branched, or cyclic, and aryl groups, having from 1 to about 20 carbon atoms, with or without substitution by halogen, silicon, hydroxy, nitrile, ester, amide, or sulfate.

4. A molding composition as in claim 1, wherein the epoxy component comprises materials within the structure represented by:

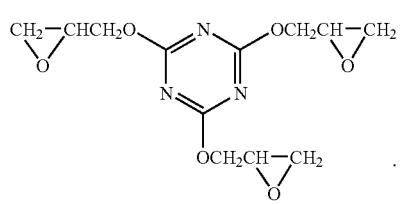

(V)

5. A molding composition as in claim 1, wherein the epoxy component comprises materials within the structure represented by:

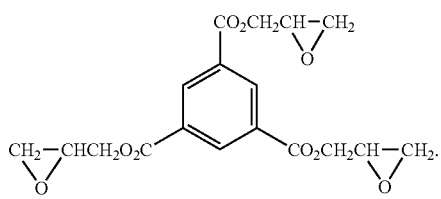

(VI)

6. A molding composition as in claim 1, wherein the epoxy component comprises materials within the structure represented by:

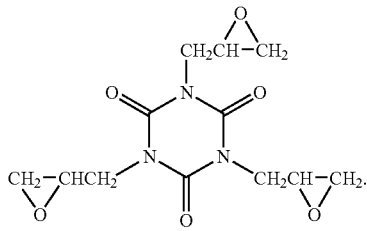

(VII)

7. A molding composition as in claim 1, wherein said anhydride component comprises a cycloaliphatic anhydride.

8. A molding composition as in claim 7, wherein said anhydride component comprises methyl hexahydrophthalic anhydride.

9. A molding composition as in claim 1, wherein said epoxy composition further comprises a polyol for promoting reaction of said epoxy component and said anhydride component.

10. A molding composition as in claim 9, wherein said polyol is selected from the group consisting of glycerol, trimethylol propane, ethylene glycol, diethylene glycol, propylene glycol, dipropylene glycol, neopentyl glycol, and mixtures thereof.

11. A molding composition as in claim 1, wherein said antioxidant material comprises an alkyl salt of propionic acid.

12. A molding composition as in claim 11, wherein said antioxidant material comprises a thiodialkylpropionate.

13. A molding composition as in claim 12, wherein said antioxidant material comprises a thiodiethylenepropionate.

14. A molding composition as in claim 13, wherein said antioxidant material comprises thiodiethylene bis[3-(3,5-di-tert-butyl-4-hydroxyphenyl) propionate].

15. A molding composition as in claim 1, wherein said phosphor material is capable of converting ultraviolet and blue light into visible white light.

16. A molding composition as in claim 1, wherein said phosphor comprises yttrium aluminum garnet.

17. A molding composition as in claim 1, wherein said epoxy component comprises from about 20 weight percent to about 75 weight percent of said molding composition based on the total weight of the molding composition.

18. A molding composition as in claim 1, wherein said anhydride component comprises from about 20 weight percent to about 75 weight percent of said molding composition based on the total weight of the molding composition.

19. A composition as in claim 1, wherein said antioxidant material comprises from about 0.01 weight percent to about 5 weight percent of said molding composition based on the total weight of the molding composition.

20. A molding composition as in claim 1, wherein said phosphor material comprises from about 0.5 weight percent to about 35 weight percent of said molding composition based on the total weight of the molding composition.

* * * * *